United States Patent [19]

Hochreuther

[11] Patent Number: 4,696,189

[45] Date of Patent: Sep. 29, 1987

[54] HOUSING FOR A MEASURING DEVICE

[75] Inventor: Karl Hochreuther, Nuremberg, Fed. Rep. of Germany

[73] Assignee: Brown, Boveri & Cie AG, Mannheim, Fed. Rep. of Germany

[21] Appl. No.: 850,265

[22] Filed: Apr. 10, 1986

[30] Foreign Application Priority Data

Apr. 13, 1985 [DE] Fed. Rep. of Germany ....... 3513345

[51] Int. Cl.[4] .......................... G01D 11/24; G01R 1/04
[52] U.S. Cl. ...................................... 73/431; 324/149; D10/75
[58] Field of Search ................... 73/431; 324/156, 149; 374/208; D10/75, 78, 79, 103

[56] References Cited

U.S. PATENT DOCUMENTS 3,946,613 3/1976 Silver .................................. 73/431 X
4,476,721 10/1984 Hochreuther et al. ................ 73/431
4,577,512 3/1986 Löwenheck ...................... 73/431 X Primary Examiner—Tom Noland
Attorney, Agent, or Firm—Herbert L. Lerner; Laurence A. Greenberg

[57] ABSTRACT

A measuring device housing includes two mutually assembled housing shells having mutually engaged dust protection edges, a trowel shape with a relatively narrow handle-type holder part changing into a relatively wide plate-type indicator part, an operating surface having sides, a switching wheel operating element mounted on the operating surface and extending beyond one of the sides thereof, and another operating element disposed on the operating surface laterally of the switching wheel, the operating elements being disposed within the swinging range of a thumb of the right hand of an operator of the measuring device gripping the holder part from behind for actuating the operating elements.

12 Claims, 6 Drawing Figures

Fig. 2
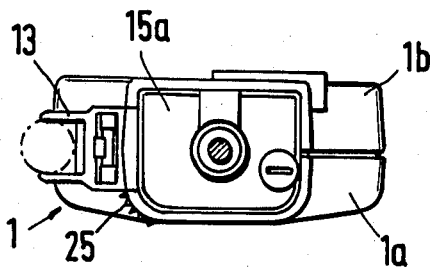
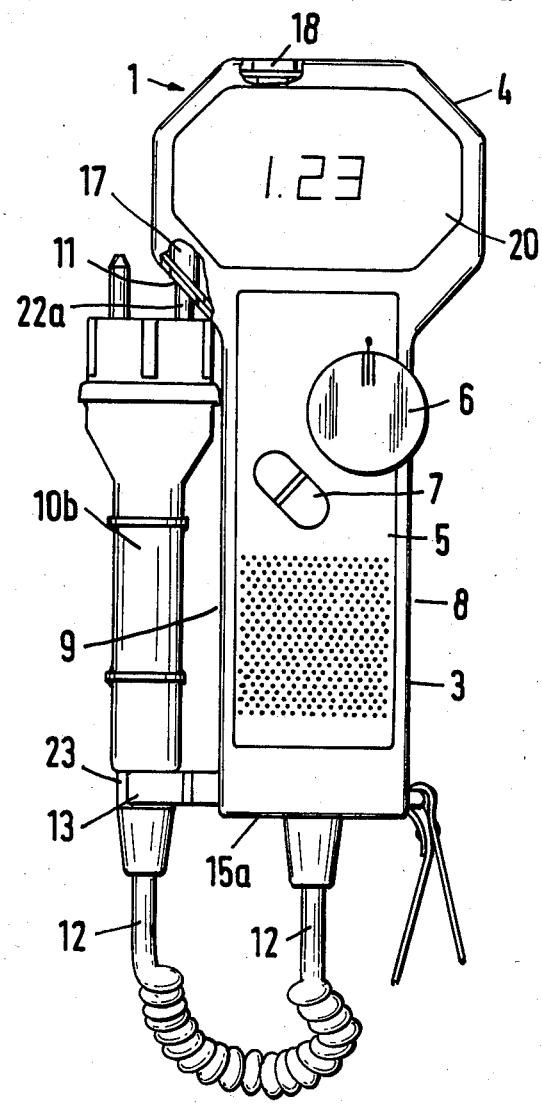
Fig. 1

HOUSING FOR A MEASURING DEVICE

BACKGROUND OF THE INVENTION

1. Field of the Invention

The invention relates to a housing for a measuring device formed of two housing shells engaging each other through dust protection edges.

2. Description of the Related Art

As far as their construction is concerned, conventional measuring devices are produced as desk-top equipment. The measuring device is placed on a deposition surface and is connected through two measuring lines to measuring prods or probes which the operator holds in his hand when examining an object to be measured. Normally, at least one hand must be free for operating a measuring range selector, for instance, for the purpose of switching. A suitable deposition surface for the measuring equipment is frequently not available for testing work during installations. Therefore, measuring devices have been developed which are held by a belt hung around the neck. However, even in this case, both hands are required for the two measuring prods or probes, which makes the operation of the measuring device more difficult.

While there is miniaturized measuring equipment available which is built directly into the measuring probe and is therefore held in the hand together with the measuring probe, these devices are not suitable for demanding testing problems involving high voltages or large currents. In addition, a miniaturized device is definitely undesirable for some applications.

SUMMARY OF THE INVENTION

It is accordingly an object of the invention to provide a measuring device housing which overcomes the hereinafore-mentioned disadvantages of the heretofore-known devices of this general type, that can be held conveniently in one hand, and can be operated with the same hand without the need to change the position of the hand while the other hand remains free for auxiliary functions, such as for operating a measuring probe.

With the foregoing and other objects in view there is provided, in accordance with the invention, a measuring device housing, comprising two mutually assembled housing sheels having mutually engaged dust protection edges, a trowel or ladle shape with a relatively narrow handle-type holder part changing into a relatively wide plate-type indicator part, an operating surface having sides, a switching wheel operating element mounted on the operating surface and extending beyond one of the sides thereof, and another operating element such as a switching lever or rocker or toggle switch disposed on the operating surface laterally of the switching wheel, the holder being dimensioned in such a way that the operating elements are disposed within the swinging or tilting range of movement of a thumb of the right hand of an operator of the measuring device gripping the holder part from behind for actuating the operating elements.

The trowel-shaped construction of the housing provides an indicator part which is not inferior to conventional desk-top equipment as far as size is concerned. At the same time, the handle-shaped holding part can be gripped conveniently from the rear by the right hand without obstructing the view of the operating or indicator parts with parts of the hand. It is possible to actuate two mutually independent operating elements with swinging movements of the thumb alone.

In accordance with another feature of the invention, the holder part has mutually opposite finger and thumb sides, and the housing includes a measuring probe having a free end disposed in a recess formed in the indicator part protruding over the holder part and another end, a mounting fork detachably fastening the other end of the measuring probe to the housing shells, and a connecting cable connected between the other end of the measuring probe and the housing shells. This construction utilizes the fact that the indicator part extends above the holding part. Thus, a recess provided in the indicator part in conjunction with a mounting fork attached to the holding part, makes it possible for a measuring probe connected to the measuring device to snap in.

In accordance with a further feature of the invention, the connecting cable is helical, is inserted into a free end of the holder part opposite the indicator part and hangs down in an arc between the holder part and the housing shells, when the holder part is disposed vertically. In the rest position, the measuring probe and the measuring device thus form a closed unit, from which only the connecting cable dangles movably in an arc.

In accordance with an added feature of the invention, the measuring probe forms a first pole, and the housing includes a measuring prod fastened to a free end of the indicator part opposite the holder part, as seen in longitudinal direction of the holder part, forming a second pole. In measuring devices for checking power lines, a probe is used which is matched to a power line plug and therefore contains both poles including the protection contact. However, if the measuring probe has only one pole, it is a considerable advantage to fasten a measuring prod to the housing at the free end of the indicator part, as seen in the longitudinal direction of the holding part, which forms the second pole.

In order to keep costs down, a housing of the same basic construction should be adaptable to different kinds of measuring devices.

Since different measuring probes also belong to different measuring devices, in accordance with an additional feature of the invention, the housing shells have an opening formed therebetween at a free end of the holder part opposite the indicator part, and the housing includes an interchangeable closure part inserted in the opening and held by projections or ribs inserted in slots. In accordance with again another feature of the invention, the mounting fork is formed on and of the same material as the closure part.

In accordance with again a further feature of the invention, there is provided at least one other closure part having another mounting fork disposed thereon of a different size than the first-mentioned mounting fork, at least one of the closure parts being a housing extension with a chamber formed therein, such as a battery case. Batteries are necessary only for certain types of measuring devices.

Different meauring probes also have contact parts of different sizes. Therefore, in accordance with again an added feature of the invention, there are provided different size holding pockets interchangeably disposed in the recess or forming the recess for receiving the free end of the measuring probe.

Since in two pole measuring probes, there is no measuring prod, in accordance with again an additional feature of the invention, the measuring probe has two poles, and the indicator part has a free end opposite the holder part having an opening formed therein for receiving a measuring prod which has been eliminated, and including a covering disposed between the housing shells covering the opening.

In according with a concomitant feature of the invention, the housing shells are in the form of upper and lower shells, the lower shell having a roughened hand area or gripping bumps on a hand area. This is done so that the housing lies in the hand more securely.

Other features which are considered as characteristic for the invention are set forth in the appended claims.

Although the invention is illustrated and described herein as embodied in a housing for a measuring device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, top-plan view of an application of the housing of the invention with a testing device for fault-current protection switches, including a measuring probe constructed as a protective contact plug;

FIG. 2 is a front-elevational view of the housing according to FIG. 1, as seen in the direction toward the closure part;

DESCRIPTION OF THE PREFERRED EMBODIMENTS

Figure 4:
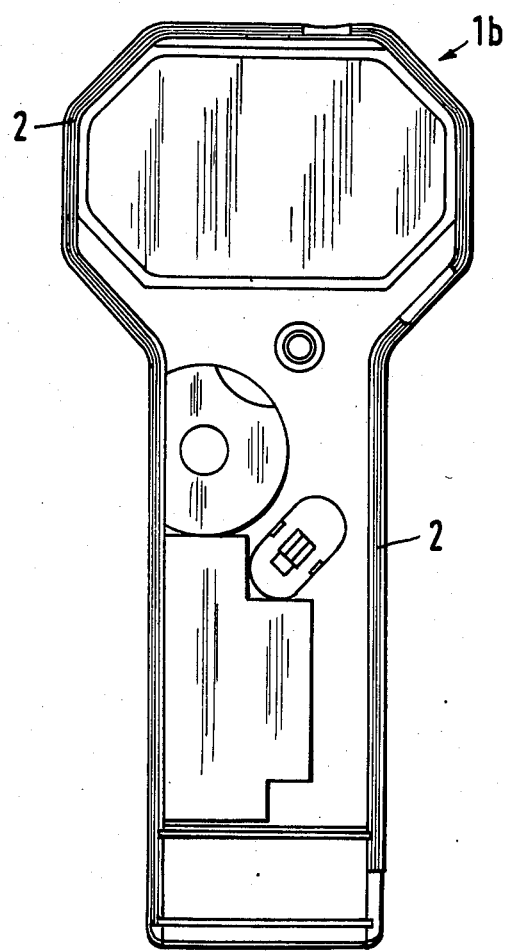
FIG. 4 is a top-plan view of the upper housing shell.

Referring now to the figures of the drawings in detail and first, particularly to FIGS. 2 and 4 thereof, there is seen a housing 1 which is formed of a lower housing shell 1a and an upper housing shell 1b. The lower housing shell 1a is framed in the vicinity of an abuttment edge thereof by a slot which is bounded at the inside thereof by a raised dust protection edge. The upper housing shell 1b also has a dust protection edge 2 which engages the slot when the two housing shells 1a, 1b are placed together. A labyrinth-like dust protection structure is obtained due to the overlap of the dust protection edges.

Figure 3:
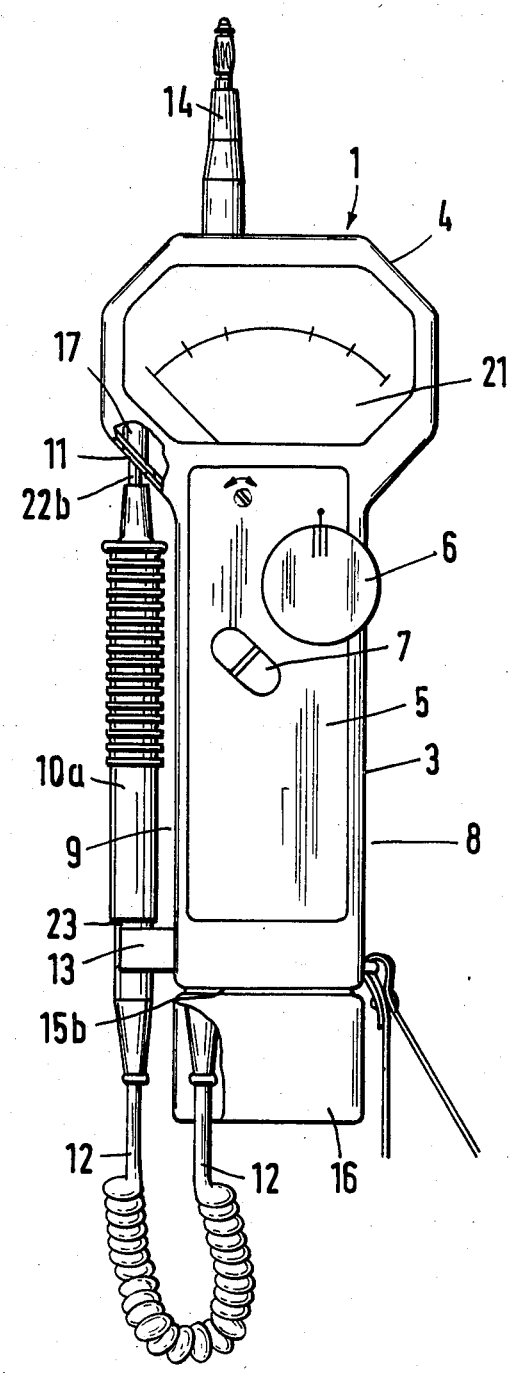
FIG. 3 is a view similar to FIG. 1 of an application of the housing to a testing device for insulation resistance, with a measuring prod fixed to the housing and a measuring prod which is movable through a connecting cable.

Referring to FIGS. 1 and 3, it is seen that the housing 1 has a trowel or spoon-like shape and is divided into a holder part 3 and an indicator part 4. If required, the indicator part 4 can be provided with a digital display 20 seen in FIG. 1 or an analog measuring element 21 seen in FIG. 3. The indicator panel can be made sufficiently large in both cases.

The holder part 3 includes a switching wheel 6 for a measuring range switch and a switching lever or rocker 7 for a switch, in the vicinity of an operating surface or area 5. The location of the two operating elements 6, 7 is adapted to the dimensions of the holder part 3, in such a way that they are in the swinging range of the thumb of the right hand of an operator who grabs the holder part 3 from behind. For convenient operation of the switching wheel 6, the wheel extends beyond the holder part 3 on the "thumb side" 8 of the housing 1.

Opposite the "thumb side" 8 is a "finger side" 9 of the housing 1 in the part of the indicator part 4 which extends beyond the holder part 3, having a recess 11 into which a contact part 22a or 22b of a measuring probe 10a or 10b can be inserted. A mounting fork 13 fastened to the free end of the holder part 3 grips the measuring probe in the vicinity of an insulating hand piece 23 thereof. After the contact part 22a or 22b has been inserted into the recess 11, a slight pressure is sufficient to make the hand piece 23 snap into the mounting fork 13.

A helically or spirally contracting connecting cable 12 connects the measuring probe 10a or 10b to the housing 1 in a relatively narrow arc so that danger due to dangling measuring lines is eliminated.

A substantially important object of the invention is to provide a detailed mechanical construction of the housing 1 which accommodates different variations of the housing to be used for different measuring devices with the same housing shells 1a, 1b. In order to obtain the easiest possible interchangeability of a variation of parts, the parts are inserted between the two housing shells 1a, 1b, i.e., in the vicinity of a parting gap, and are anchored to the housing 1 by slots and tabs.

A first variation of a part of this kind is a measuring prod 14 shown in FIG. 3 which can be firmly connected to the housing and is always needed in connection with such measuring or testing devices having a measuring probe 10a with only one pole. With equipment of this kind, only a measuring probe 14 which is fixed to the housing enables the operator of the device to hold the measuring device in one hand, to operate the operating elements 6, 7 at the same time and also to establish electrical contacts with the measuring object. If a multiple pole measuring probe 10b shown in FIG. 1 is required, the measuring prod 14 is eliminated and the remaining hole is closed by a covering 18.

Another variation of such a part is a closure part 15a or 15b which closes an opening remaining in the two housing shells 1a, 1b at the free end of the holding part 3. The closure part 15a or 15b which is also fastened to the housing by mutually engaging slots and ribs or tabs, first of all serves the purpose of supporting the mounting fork 13 formed of the same material. Since the mounting fork 13 must seize different measuring probes 10a, 10b, it too can be made with different dimensions and can easily be interchanged by changing the closure part 15a or 15b.

Figure 5:
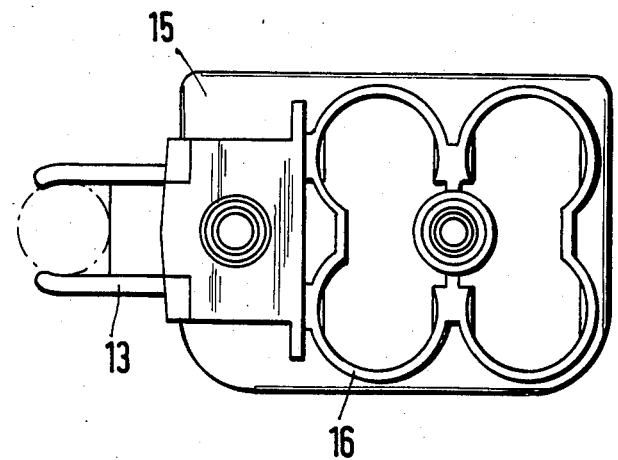
FIG. 5 is a front-elevational view of a closure part with a housing extension.
Figure 6:
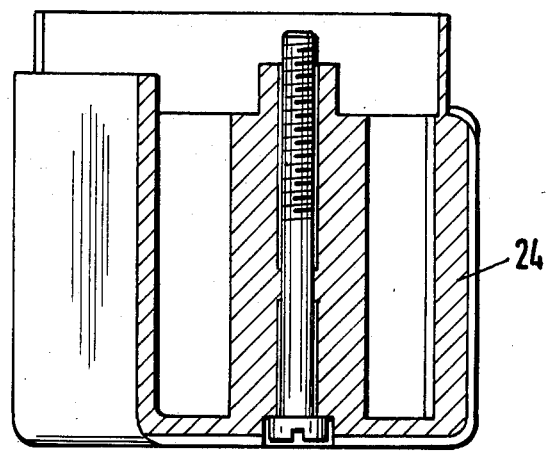
FIG. 6 is a cross-sectional view of a cap for the housing extension.

In order to enlarge the relatively small space within the housing 1, the closure part 15 assumes another function, as shown in the embodiment illustrated in FIGS. 5 and 6 which is the provision of a housing extension 16. For instance, in measuring devices with a battery power supply, the housing extension 16 can contain the batteries. In order to change batteries, a cap 24 of the housing extension 16 is detached from the closure part 15.

Since the contact parts 22a, 22b of the measuring probes 10a, 10b also vary, the size of the recess 11 provided in the indicator part 4 must be variable. To this end, a correspondingly matched holding pocket 17 is inserted between the two housing shells 1a, 1b.

The back of the housing 1 is provided with knurled gripping bumps 25 so that when the housing lies in the hand, it is secure against sliding.

The foregoing is a description corresponding in substance to German application No. P 35 13 345.7, filed Apr. 13, 1985, the International priority of which is being claimed for the instant application, and which is hereby made part of this application.

I claim:

1. Measuring device housing, comprising two mutually assembled housing shells having mutually engaged dust protection edges, a trowel shape with a relatively narrow handle-type holder part changing into a relatively wide plate-type indicator part, an operating surface having mutually opposite finger and thumb sides, a switching wheel operating element mounted on said operating surface and extending beyond said thumb side thereof, another operating element disposed on said operating surface laterally of said switching wheel, said operating elements being disposed within the swinging range of a thumb of the right hand of an operator of the measuring device gripping said holder part from behind for actuating said operating elements, a measuring probe having a free end disposed in a recess formed in a portion of said indicator part protruding over said holder part and another end, a mounting fork detachably fastening said other end of said measuring probe to said housing shells, and a connecting cable connecting between said other end of said measuring probe and said housing shells.

2. Measuring device housing according to claim 1, wherein said other operating element is a switching lever.

3. Measuring device housing according to claim 1, wherein said connecting cable is helical, is inserted into a free end of said holder part opposite said indicator part and hangs down in an arc between said holder part and said housing shells, when said holder part is disposed vertically.

4. Measuring device housing according to claim 1, wherein said measuring probe forms a first pole, and including a measuring prod fastened to a free end of said indicator part opposite said holder part, as seen in longitudinal direction of said holder part, forming a second pole.

5. Measuring device housing according to claim 1, wherein said housing shells have an opening formed therebetween at a free end of said holder part opposite said indicator part, and including an interchangeable closure part inserted in said opening and held by projections inserted in slots.

6. Measuring device housing according to claim 1, wherein said housing shells have an opening formed therebetween at a free end of said holder part opposite said indicator part, and including an interchangeable closure part inserted in said opening and held by projections inserted in slots, said mounting fork being formed on and of the same material as, said closure part.

7. Measuring device housing according to claim 6, including at least one other closure part having another mounting fork disposed thereon of a different size than said first-mentioned mounting fork, at least one of said closure parts being a housing extension with a chamber formed therein.

8. Measuring device housing according to claim 7, wherein said chamber is a battery case.

9. Measuring device housing according to claim 1, including different size holding pockets interchangeably disposed in said recess for receiving said free end of said measuring probe.

10. Measuring device housing according to claim 1, wherein said measuring probe has two poles, and said indicator part has a free end opposite said holder part having an opening formed therein for receiving a measuring prod, and including a covering disposed between said housing shells covering said opening.

11. Measuring device housing according to claim 1, wherein said housing shells are in the form of upper and lower shells, said lower shell having a roughened hand area.

12. Measuring device housing according to claim 1, wherein said housing shells are in the form of upper and lower shells, said lower shell having gripping bumps on a hand area.

* * * * *